United States Patent
Ueda et al.

(10) Patent No.: US 6,787,011 B2
(45) Date of Patent: Sep. 7, 2004

(54) CYLINDRICAL TARGET AND ITS PRODUCTION METHOD

(75) Inventors: Hiroshi Ueda, Takasago (JP); Toshihisa Kamiyama, Takasago (JP); Kouichi Kanda, Takasago (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 10/383,509

(22) Filed: Mar. 10, 2003

(65) Prior Publication Data

US 2003/0136662 A1 Jul. 24, 2003

Related U.S. Application Data

(63) Continuation of application No. PCT/JP01/07110, filed on Sep. 5, 2001.

(30) Foreign Application Priority Data

Sep. 8, 2000 (JP) ........................................ 2000-273572

(51) Int. Cl.[7] .............................................. C23C 14/34
(52) U.S. Cl. .............................. 204/298.12; 204/192.1; 204/298.21; 204/298.22
(58) Field of Search ......................... 204/192.1, 298.12, 204/298.21, 298.22

(56) References Cited

FOREIGN PATENT DOCUMENTS

| JP | A-58-500174 | 2/1983 |
|---|---|---|
| JP | A-60-181270 | 9/1985 |
| JP | A-5-156431 | 6/1993 |
| JP | A-5-214525 | 8/1993 |
| JP | A-7-228967 | 8/1995 |
| JP | 09-104974 A | 4/1997 |
| JP | 10-317133 | * 12/1998 |
| JP | A-11-71667 | 3/1999 |

OTHER PUBLICATIONS

Microfilm of the specification and drawings annexed to the request of the Japanese Utility Model Application No. 110742/1978 (Laid–open No. 26094/1980), (Matsushita Electric Ind. Co., Ltd.). Feb. 20, 1980.

* cited by examiner

Primary Examiner—Rodney G. McDonald
(74) Attorney, Agent, or Firm—Oblon, Spivak, McClelland, Maier & Neustadt, P.C.

(57) ABSTRACT

A cylindrical target having a cylindrical backing tube and hollow cylindrical target material disposed on an outer circumference of the cylindrical backing tube. The backing tube and the target material are joined via an electroconductive felt present beteween the backing tube and the target material.

12 Claims, 8 Drawing Sheets

Fig. 5 Initial physical property of carbon felt/sheet

|  | Felt | Sheet |
|---|---|---|
| Thickness (mm) | 0.5-10 | 0.2-2 |
| Density (g/cm$^3$) | 0.05-0.5 | 0.5-1.5 |
| Thermal conductivity in the direction of thickness (W/m·K) | 0.5-2 | 2-6 |
| Volume resistivity in the direction of thickness (Ω·cm) | 0.1-100 | 0.01-0.1 |

CYLINDRICAL TARGET AND ITS PRODUCTION METHOD

DESCRIPTION

This application is a continuation of PCT/JP01/07110 filed Sep. 5, 2001.

TECHNICAL FIELD

The present invention relates to the structure of a cylindrical target to be applied to a magnetron sputtering apparatus (particularly, a direct-current magnetron sputtering apparatus) to be employed for forming a thin film, and its production method.

BACKGROUND ART

The magnetron sputtering method is known as one of techniques to form a thin film on a substrate of e.g. glass or plastic. JP-A-5-501587 discloses a sputtering system employing a rotating cylindrical target. This apparatus has a magnet inside the cylindrical target, and sputtering is carried out while the target is cooled from the inside and the target is rotated. The cylindrical target has advantages of a high efficiency of utilization and a high film-forming speed as compared with a flattened (planar type) target.

With respect to a production method of a cylindrical target, JP-A-5-214525 discloses a method of building up by a plasma spray method a target material as a film material to be sputtered, on the outer surface of a backing tube made of e.g. stainless steel or titanium. Further, there has also been known e.g. a method of disposing a target material formed to have a cylindrical shape, on the outer circumferential surface of a backing tube, and inserting a metal such as indium between both members to bond them, or a method of forming a one-piece body including the part of the backing tube by the target material.

However, in the case of the plasma spray method, there is a disadvantage that the target material or the backing tube material is limited by the compatibility (for example, the difference in heat expansion) between a material available for spraying and a material of backing tube. The method of bonding with e.g. indium requires a surface treatment to the outer circumferential surface of the backing tube and the inner circumferential surface of the target material. Further, a heating apparatus for melting and injecting the indium into the bonding portion, and a consideration to prevent the melted indium from leaking, are also required. Further, in a case where the target material is made of ceramics, the heat expansion rate of the target material is generally smaller than that of the backing tube made of metal or that of indium as a bonding material, whereby a problem that a gap is formed at the bonding portion due to a shrinkage difference at the time of cooling after the bonding, occurs.

Further, the target will be replaced when the target material is worn by sputtering. In a case of a target manufactured by a spray method or an indium bonding method, the separation of the backing tube from the target material is difficult and therefore, such a target is not suitable for reuse (recycling) of the backing tube.

On the other hand, although it is possible to form a one-piece body including the part of the backing tube by the target material, the structure of such one-piece type target does not have enough reliability because ceramics or some kinds of metal material have an insufficient strength, or a low durability to a mechanical impact. Further, there is a problem of manufacturing cost if the one-piece body is formed by an expensive target material.

The present invention has been made under consideration of such circumstances, and it is an object of the present invention to provide a cylindrical target which can broaden the possibility of selecting the target material and the backing tube material, which can simplify the manufacturing, and which can increase the capability of reuse (recycling), and to provide its manufacturing method.

DISCLOSURE OF THE INVENTION

In order to achieve the above object, the cylindrical target of the present invention is characterized in that a hollow cylindrical target material is disposed on the outer circumference of a cylindrical backing tube, and said backing tube and said target material are joined via a buffer material present between said backing tube and said target material.

BRIEF DESCRIPTION OF THE DRAWINGS

FIG. 5 is a table showing an example of initial physical values of a carbon felt and a carbon sheet.

EXPLANATION OF NUMERIC SYMBOLS

Figure 1:
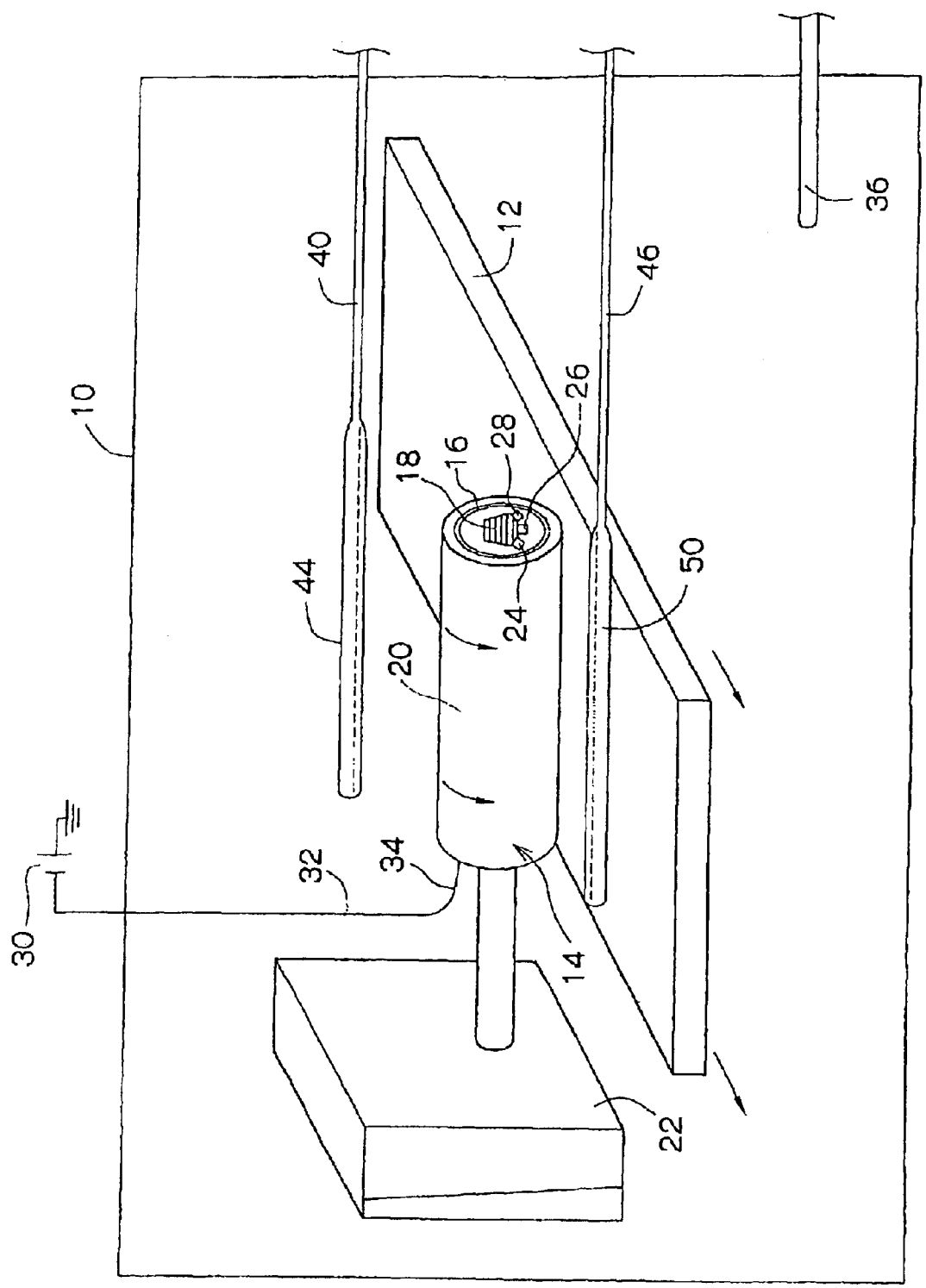
FIG. 1 is a diagram of a cylindrical magnetron sputtering system to which the cylindrical target of the present invention is applied.

10 Sealed reaction chamber
12 Substrate
14 Cylindrical target
16 Backing tube
17 Taper jig
18 Magnet unit
20 Target material
20 A Step portion
14 Cylindrical target
14 Cylindrical target
22 Target driving device
24, 26, 28 Magnetic pole
30 DC power supply
32 Power line
34 Sliding contact point
36 Outlet tube
38 Vacuum pump
40 First gas supply tube
44, 50 Nozzle
46 Second gas supply tube
52 Electroconductive felt (buffer member)
53 Heat resisting O-ring

BEST MODE FOR CARRYING OUT THE INVENTION

According to the present invention, a buffer member is present between a target material as the material to form a film, and a backing tube (target holder) supporting the target material, whereby the volume change due to their heat expansion difference can be absorbed by the buffer member. Therefore, the degree of freedom of the combination of the target material and the backing tube material, will expand and more proper selection of the materials will be possible. Further, the operation of separating a worn target material from the backing tube is easy, and the reuse of the backing tube is possible.

As an embodiment of disposing a buffer member between the target material and the backing tube, it is preferred to compressively pack a compression-deformable sheet-shaped buffer member between the backing tube and the target material. Here, the sheet-shaped buffer member may be previously formed to have a cylindrical shape for use.

There is an embodiment of employing an electroconductive felt or an electroconductive sheet as said buffer member. According to an embodiment of the present invention, a carbon felt is applied as said electroconductive felt. Such a carbon felt preferably has a density of from 0.05 to 0.5 g/cm$^3$ in the initial state before it is compressively packed (hereinafter referred to simply as initial state) from the viewpoint of buffering performance.

The carbon felt employed in the present invention is preferably has a thickness of from 0.5 to 10 mm in the initial state, and the compression ratio is preferably from 10 to 80% when it is compressively packed. Further, the carbon felt preferably has a volume resistivity in the direction of thickness of from 0.1 to 100 Ω·cm in the initial state from the viewpoint of electric conductivity.

In order to provide a method of producing a cylindrical target having the above construction, the production method of the cylindrical target according to the present invention, is characterized in that a buffer member disposed on the inner surface of a target material having a hollow cylindrical shape, a backing tube is inserted thereinto, so that by this inserting operation, said buffer member is positioned between the outer circumferential surface of said backing tube and the inner surface of said target material, whereby said target material is joined to said backing tube to obtain a cylindrical target.

As an embodiment of the above production method, there is an embodiment wherein a compression-deformable sheet-shaped buffer member is provided on the inner surface of said target material, and by the inserting operation of said backing tube, said buffer member is compressed, whereby said buffer member is packed between the outer circumferential surface of said backing tube and the inner surface of said target material.

Further, the above buffer member such as a carbon felt, will be in a state that particles are apt to generate, when it is compressively packed. Therefore, in order to prevent the particle generation during the sputtering, it is preferred to dispose a seal member such as a heat resisting O-ring at the inner surface portion of each end of the target material.

In the following, preferred embodiments of the cylindrical target according to the present invention and its production method will be described with reference to the drawings attached.

At first, the construction of a magnetron sputtering system employing the cylindrical target to which the present invention is applicable, will be described with reference to JP-A-5-501587. FIG. 1 is a diagram of a cylindrical magnetron sputtering system. Here, the cylindrical target as identified by a numeric symbol 14 in the drawing, is illustrated in a cross-sectional view so as to show the internal structure. A sealed reaction chamber 10 in which plasma is generated and a substrate 12 as an object to form a film is disposed, is kept in vacuum. The cylindrical target 14 of the present invention comprises a backing tube 16 and a target material 20 disposed on the outer circumference of the backing tube 16. A compression-deformable sheet-shaped buffer member (electroconductive felt 52 in this embodiment) is compressively packed between the backing tube 16 and the target material 20, whereby the backing tube 16 and the target material 20 are joined. Here, as illustrated FIG. 1, a magnet unit 18 is accommodated in the backing tube 16. The backing tube 16 is cooled by passing a cooling liquid such as water therethrough.

The backing tube 16 holding the target material 20, is supported by a target driving device 22 so that it can be rotated around its longitudinal axis. In FIG. 1, a flattened substrate 12 is held horizontally, and the longitudinal axis of the cylindrical target 14 is also held horizontally. However, the relative disposition between the substrate 12 and the cylindrical target 14 is not limited thereto.

A magnet unit 18 includes three rows of magnetic poles 24, 26 and 28 disposed parallelly along the axis of the backing tube 16. The magnetic poles 24, 26 and 28 are disposed to have N pole, S pole and N pole respectively, and lines of magnetic force pass through the backing tube 16 and enter into the neighboring magnetic pole having the opposite polarity. By this magnetic pole disposition, a magnetic tunnel is formed to increase the sputtering speed.

The cathode potential V required to generate sputtering, is provided from a DC power supply 30 through a power line 32 and a sliding contact point 34 to the backing tube 16. Further, in order to obtain a low pressure required for sputtering, the sealed reaction chamber 10 is provided with an outlet tube 36, to be connected to a vacuum pump, not shown.

The sealed reaction chamber 10 is provided with a gas supply means to supply gas required for sputtering. A first gas supply tube 40 is arranged from an inert gas source, not shown, to the sealed reaction chamber 10. A nozzle 44 connected to the first gas supply tube 40, distributes an inert gas (e.g. argon gas) to the upper region of the cylindrical target 14. The inert gas introduced in the sealed reaction chamber 10, is ionized to collide with the surface of the target material 20 under the influence of electrical field in the magnetic field region.

A second gas supply tube 46 is extended from a reactive gas source, not shown, to the inside of the sealed reaction chamber 10. A nozzle 50 connected to the second gas supply tube 46, distributes a reactive gas (e.g. pure oxygen) to the vicinity of the substrate 12 over its width. Molecules of the reactive gas are combined with molecules sputtered from the target surface as a result of the ionic collision, to thereby form predetermined molecules to be deposited on the surface of the substrate 12.

Figure 2:
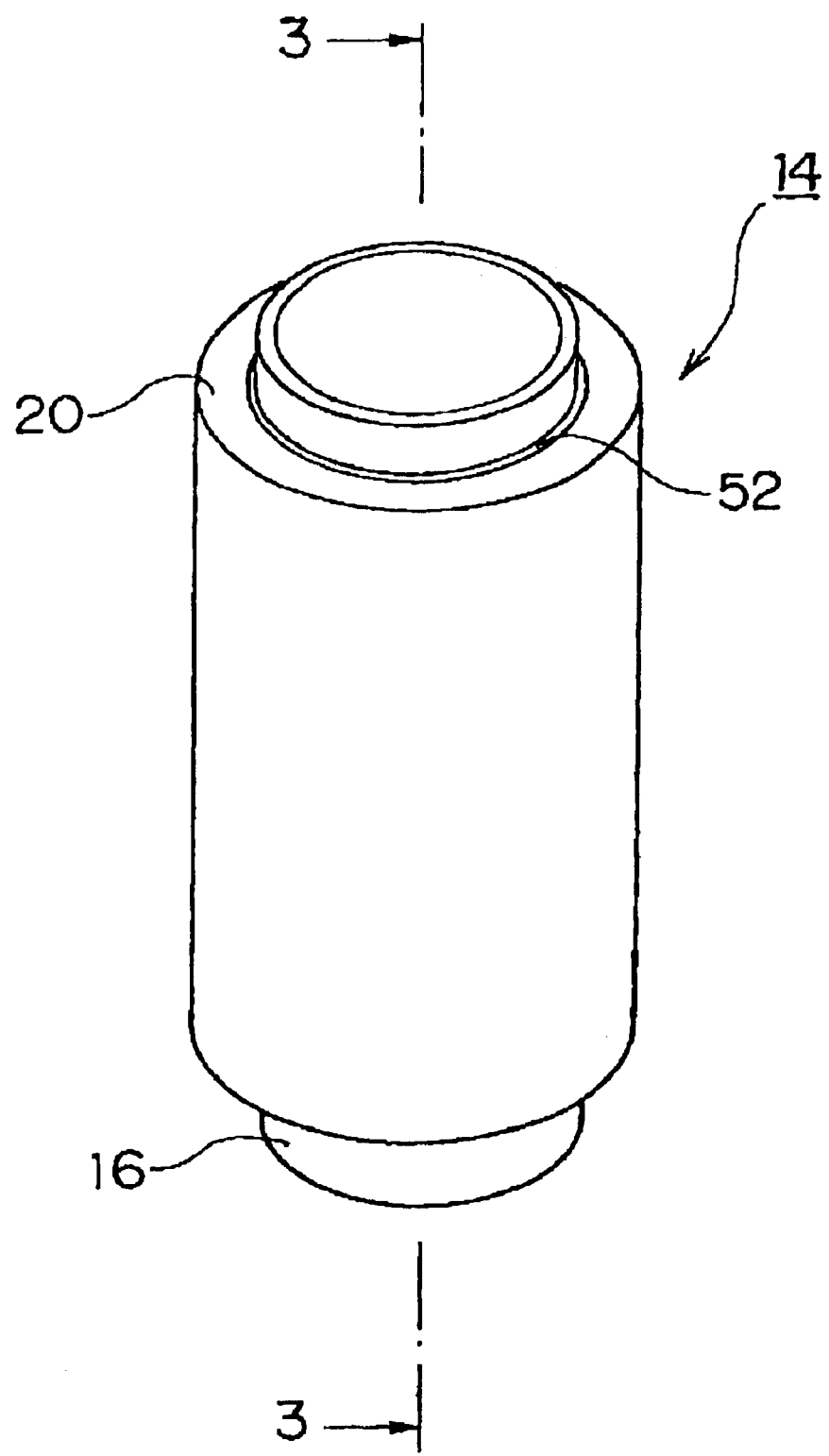
FIG. 2 is a perspective view of the cylindrical target according to an embodiment of the present invention.
Figure 3:
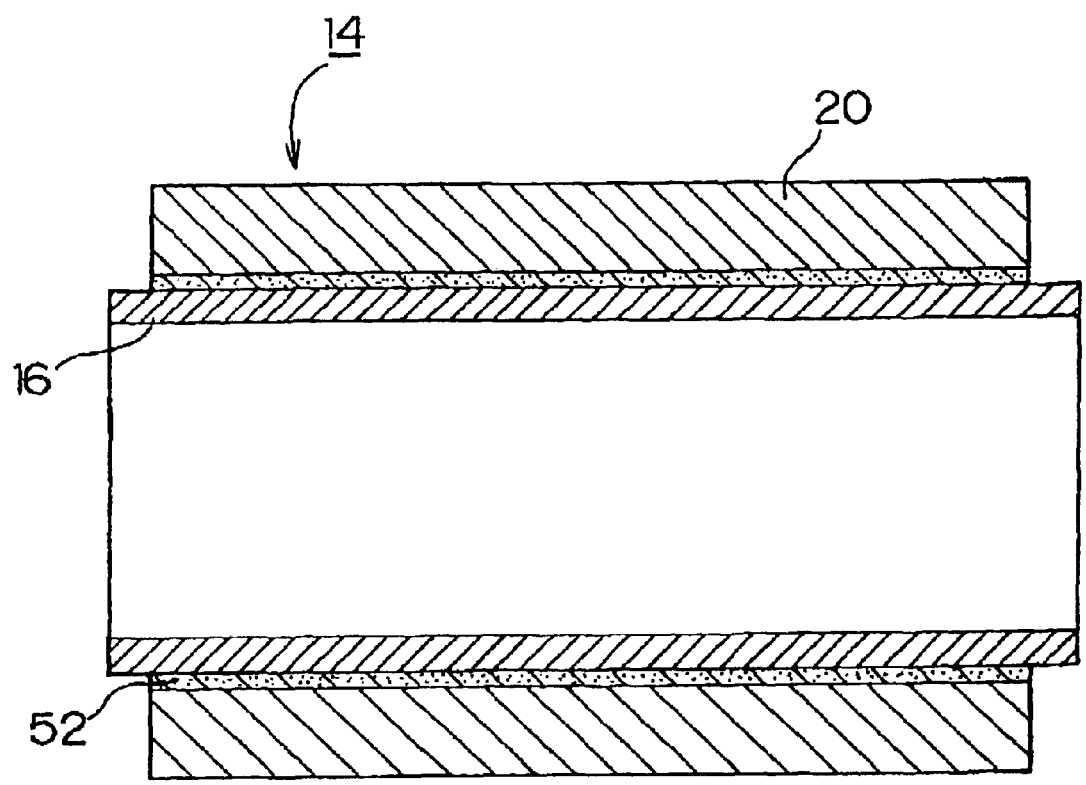
FIG. 3 is a cross-sectional view along a line 3—3 in FIG. 2.
Figure 4:
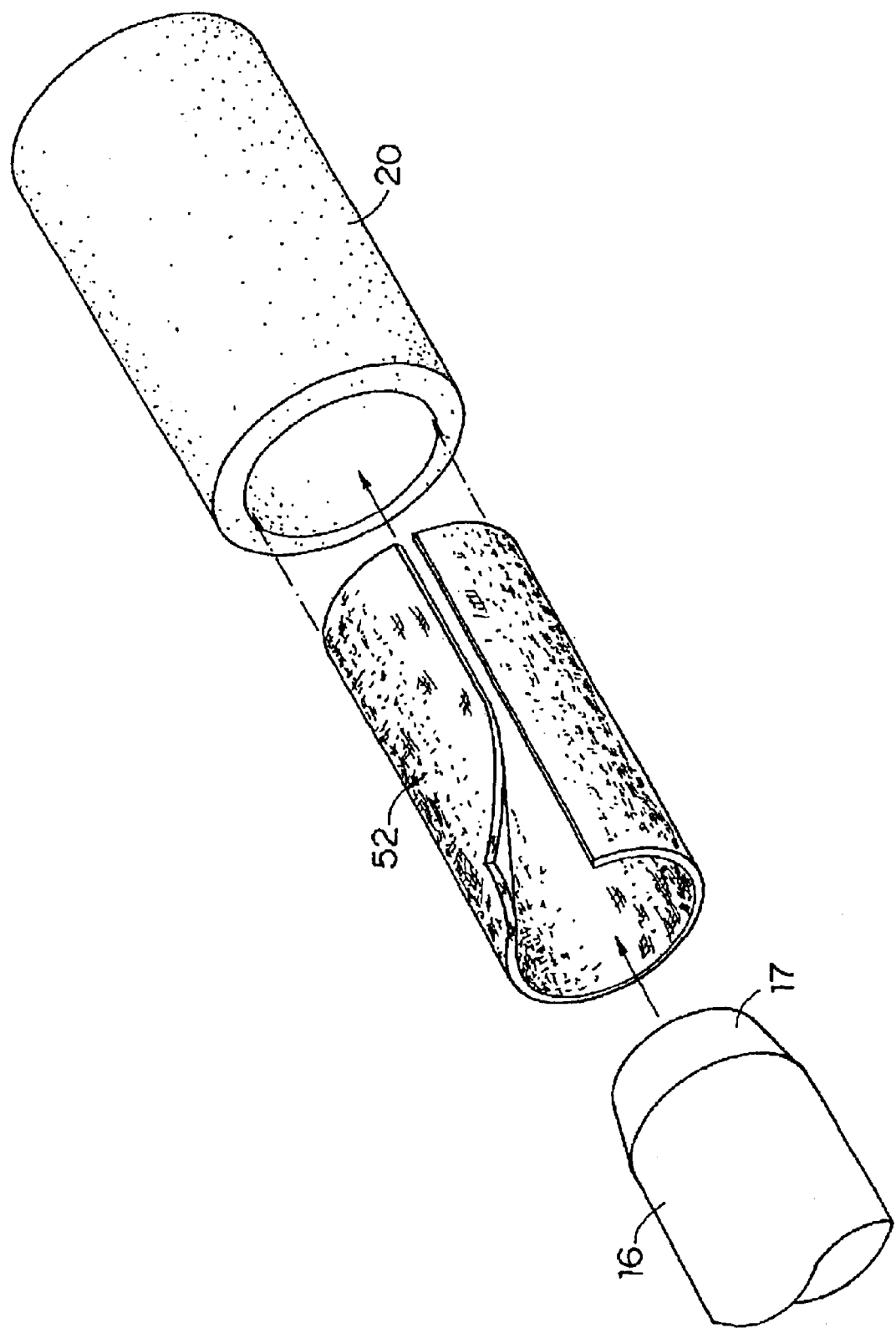
FIG. 4 is an exploded perspective view of the cylindrical target at the time of manufacturing according to an embodiment of the present invention.

FIG. 2 is a perspective view of the cylindrical target according to an embodiment of the present invention, FIG. 3 is a cross-sectional view along a line 3—3 in FIG. 2, and FIG. 4 is an exploded perspective view at the time of manufacturing the target. As illustrated in these drawings, the cylindrical target 14 is constituted by joining the backing tube 16 made of metal as an inner cylinder and the cylindrical target material 20 as an outer cylinder, by compressively packing an electroconductive felt 52 as a buffer member therebetween. Here, an electroconductive sheet can be employed instead of the electroconductive felt 52. However, the following description will be made by exemplifying felt.

The target material 20 is a hollow cylindrical member made of metal or ceramics as a film forming material, and such one having a length of from 0.4 to 4 m, an outer diameter of from φ80 to 150 mm, an inner diameter of from φ60 to 130 mm and a thickness of from 5 to 10 mm is, for example, employed. Specifically, metals such as Sn, Al, Zn, Ti, Ag, Mo, Si—Zr and Si—Sn, and electroconductive ceramics such as ITO, SiC, Al-doped ZnO and Sn-doped ZnO are, for example, be mentioned. Particularly an electroconductive ceramics is preferred. As the backing tube 16 supporting the target material 20, such one having a length of from 0.4 to 4 m, an outer diameter of from φ60 to 130 mm, an inner diameter of from φ50 to 120 mm, and a thickness of from 2 to 5 mm is, for example, employed so as to correspond to the dimension of the target material 20. As a material for the backing tube 16, a metal such as stainless steel, copper, titanium or molybdenum, may be used. The electroconductive felt 52 is a felt type sheet member made of fibers having an electrical conductivity, and for example, a carbon felt (or sheet) made of carbon fibers, is applicable.

As illustrated in FIG. 4, the electroconductive felt 52 is provided (wound) on the inner surface of the target material 20, and they are fit to the outside of the backing tube 16 by employing a special jig (not shown). By this operation, the electroconductive felt 52 is compressed. Whereby the target material 20 and the backing tube 16 are joined. Here, at the front end portion of the backing tube 16, a taper jig 17 is attached to make the insertion easier.

FIG. 5 shows an example of initial physical properties of a carbon felt and a carbon sheet useful in the above embodiment. As the electroconductive felt (or sheet) 52, such one having, as the initial properties (properties in a state before it is compressively packed), a thickness larger than the gap between the inner diameter of the target material 20 and the outer diameter of the backing tube 16 is used. If the dimension of the gap between the target material 20 and the backing tube 16 has a large variation, the electroconductive material may be packed in the entire gap by employing a carbon felt which has a higher cushion property than a carbon sheet.

For example, by compressively packing a carbon felt having an initial thickness of from 0.5 to 10 mm (preferably from 1 to 5 mm), in a gap of from 0.1 to 8 mm (preferably from 0.5 to 2.5 mm), the backing tube 16 and the target material 20 are joined. If the initial thickness is smaller than 0.5 mm, the cushion property is not sufficiently exhibited at the time of compressing. On the contrary, if the initial thickness is larger than 10 mm, there will occur such a problem that when it is used as the target, the temperature of the target material 20 will abnormally rise to cause a problem such as destruction because the heat insulating property being a characteristic of felt is too large. Further, the outer diameter of the target material 20 becomes too large to use it because of the limitation of a device space.

The compression ratio of the felt when it is compressively packed, is from 10 to 80% (preferably from 30 to 60%). If the compression ratio is smaller than 10%, the packed density is so small that shortage of the joining strength will occur. On the contrary, if the compression ratio is larger than 80%, the fibers constituting the felt will be cut off and shortage of the joining strength will occur, or the packed density becomes so large that the joining operation will become difficult.

Figure 6:
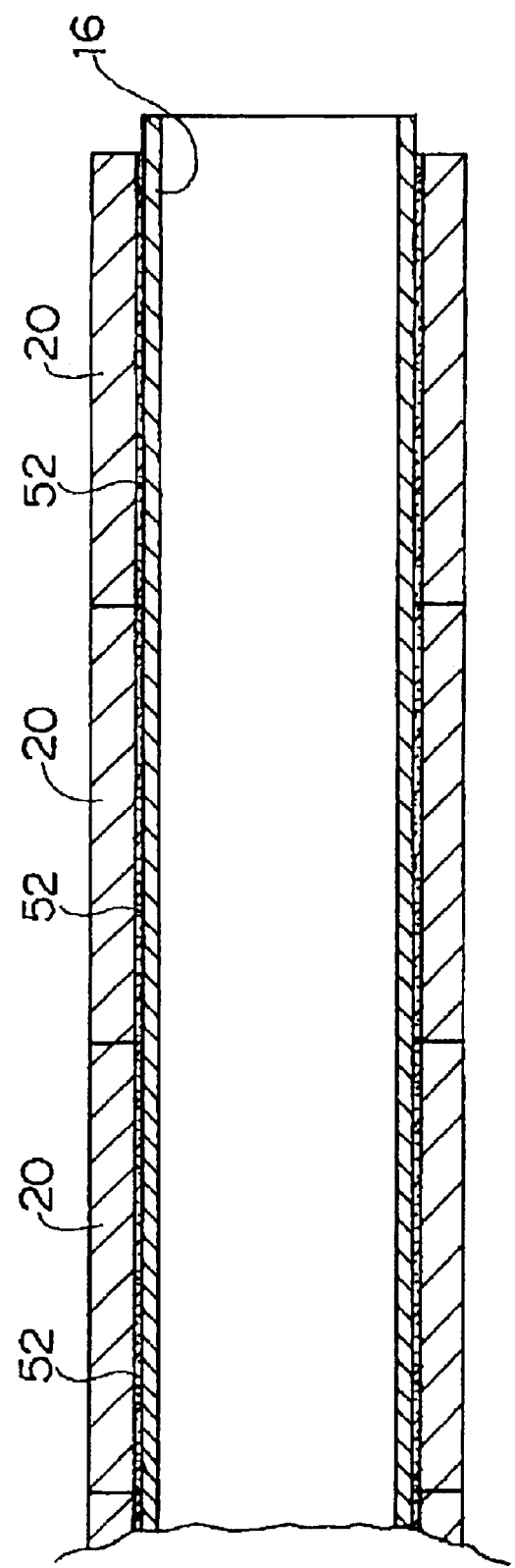
FIG. 6 is a cross-sectional view illustrating an embodiment of joining a plurality of target materials.

The carbon felt (or sheet) is used as cut from, for example, a rolled felt (or sheet) having a width of 1 m and a length of 5 m, into a piece having a size adaptable to the inner area of the target material 20. The target material 20 is formed to have a length slightly shorter than the length of the backing tube 16. The target material 20 does not need to be a one-piece body having a length larger than the length in the direction of width of the substrate 12 described in FIG. 1, and it may have a construction such that the target material 20 is divided to have a proper length to facilitate manufacturing. Then, the plurality of target materials 20 are serially connected. For example, FIG. 6 shows an embodiment that on a backing tube 16 having a length of 3 m, 10 pieces of the target material 20 each having a length of 295 mm are joined.

According to the cylindrical target 14 constituted as described above, there is a large difference in the heat expansion rate between the backing tube 16 made of metal and the target material 20 made of ceramics. However, by positioning the electroconductive felt 52 therebetween, a dimensional change due to the difference in the heat expansion can be absorbed by the electroconductive felt 52. Therefore, the degree of freedom of the combination with respect to the material of the backing tube 16 and the target material 20, will be broadened, and more proper selection of material will become possible.

When the target material 20 is worn, the target material 20 is separated from the backing tube 16, and replaced by a new target material 20. In the case of the cylindrical target 14 according to this embodiment, the operation of separating a worn target material 20 is easy, and reuse of the backing tube 16 is possible.

Further, in the case of a hollow cylindrical target material 20 made of ceramics such as silicon carbide (SiC), the inner surface of the hollow target is difficult to grind, and the accuracy of the dimension is not so good if it is in a state of so-called "burnt surface". However, in the case of the cylindrical target 14 of this embodiment, the electroconductive felt 52 having a cushion property, is compressively packed between the target material 20 and the backing tube 16 to join them. Accordingly, a high accuracy is not required for the inner dimension of the target material 20. Therefore, e.g. secondary grinding of the inner circumferential surface is not necessary and the manufacturing is easy.

EXAMPLE 1

Now, more specific embodiment of the present invention will be described with reference to Examples.

A cylindrical target for forming a $SiO_2$ thin film in a DC magnetron sputtering apparatus, was produced as follows.

As a target material 20, a hollow cylindrical SiC burnt body impregnated with Si having an outer diameter of φ152 mm, an inner diameter of φ138 mm and a length of 220 mm was prepared, and six pieces of this were connected to have a total length of 1320 mm. Here, the inner circumferential surface and the outer circumferential surface of the target material 20 were left to be a burnt surface, and both ends of the burnt body were cut to make the length to be 220 mm. The accuracy of the inner and outer diameters were about ±0.5 mm due to e.g. deformation at the time of producing the burnt body.

The backing tube 16 for supporting the target material 20 was formed by employing a commercially available tube made of SUS 304 (according to JIS G3459: 135A (outer diameter)×Sch40 (thickness)), and grinding it to have an outer diameter of φ136 mm, an inner diameter of φ127 mm and a length of 1377 mm.

The target material 20 as an outer cylinder and the backing tube 16 as an inner cylinder were joined by compressively packing a carbon felt (having an initial state density of 0.12 g/cm$^3$, and an initial state volume resistivity in the direction of thickness of 8 Ω·cm) having a thickness (thickness in the initial state) of 2 mm in the spacing therebetween. Since the spacing is 1 mm in average, the compression ratio of the carbon felt at this time becomes 50%.

The carbon felt was used as cut from a commercially available rolled felt having a width of 1 m and a length of 5 m, into a piece having a size adaptable to the inner area of the target material 20, namely 430 mm×220 mm.

The step of joining was such that a cut carbon felt was provided (wound) on the inner surface of the target material 20, and they were fit on the outside of the backing tube 16 by employing a special jig, and by repeating this operation, six pieces of the target material 20 were joined to obtain a target material having a total length of 1320 mm.

The special jig to be employed for the joining step was a device which can fix the outer circumferential surface of a target material 20 having a carbon felt provided (wound) on the inner circumferential surface, and can set a backing tube 16 so that it becomes coaxial with the target material 20, whereby the backing tube 16 can be inserted into the target material 20 by a hydraulic pressure.

Here, the joining can be carried out smoothly by attaching a taper-shaped jig (a member identified by a numeric symbol 17 in FIG. 4.) to the front end of the backing tube 16. This taper jig 17 will be removed after the joining.

The cylindrical target thus obtained was attached to a DC magnetron sputtering apparatus to carry out sputtering. The back pressure was 1.3×10$^{-3}$ Pa, and the sputtering pressure was 0.4 Pa at this time. Further, a mixture gas comprising oxygen/argon=1/1 (volume ratio) was employed as the sputtering gas. During the sputtering, stable discharging was confirmed. It was further confirmed that on a glass substrate (which corresponds to a substrate 12 in FIG. 1) a desired SiO$_2$ thin film was formed.

Further, the target material 20 worn by sputtering, can easily be removed from the backing tube 16 by using the above special jig for joining, and accordingly, the backing tube 16 can be reused.

Next, another embodiment of the present invention will be described.

Figure 7:
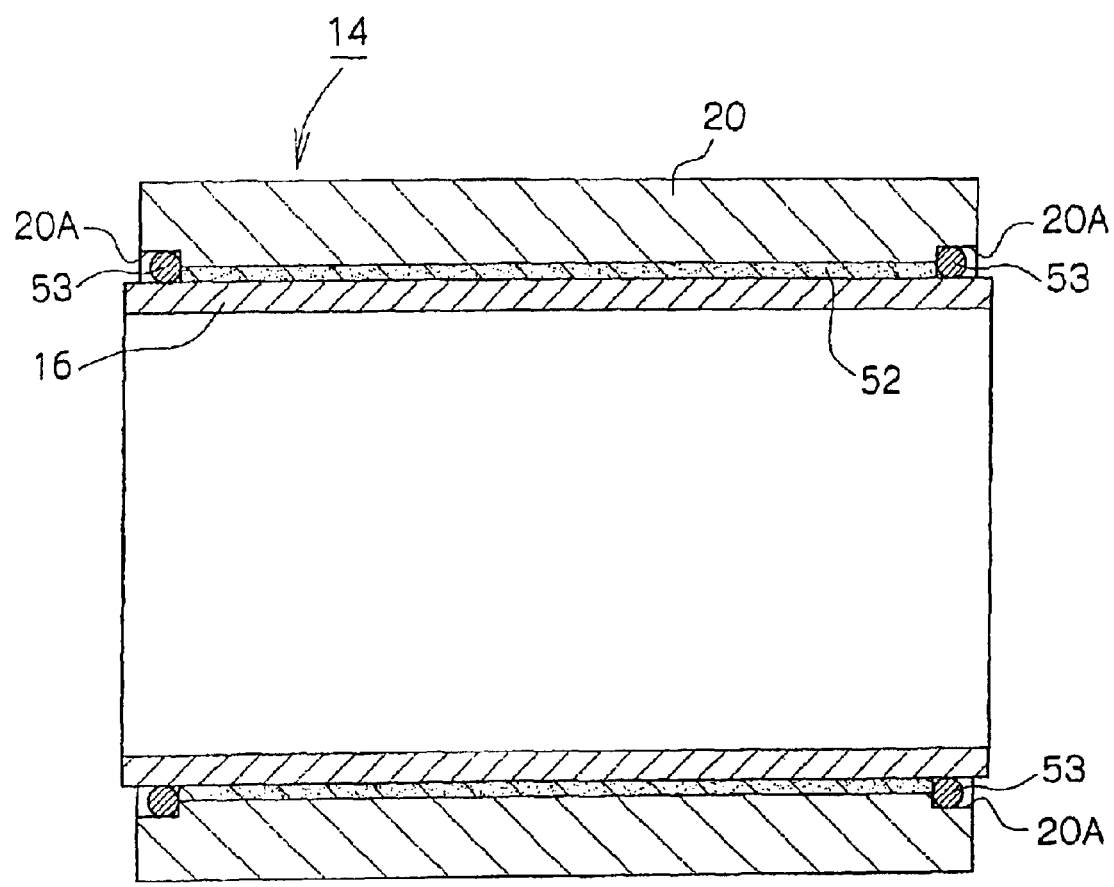
FIG. 7 is a cross-sectional view of a cylindrical target with heat resisting O-rings inserted thereto.
Figure 8:
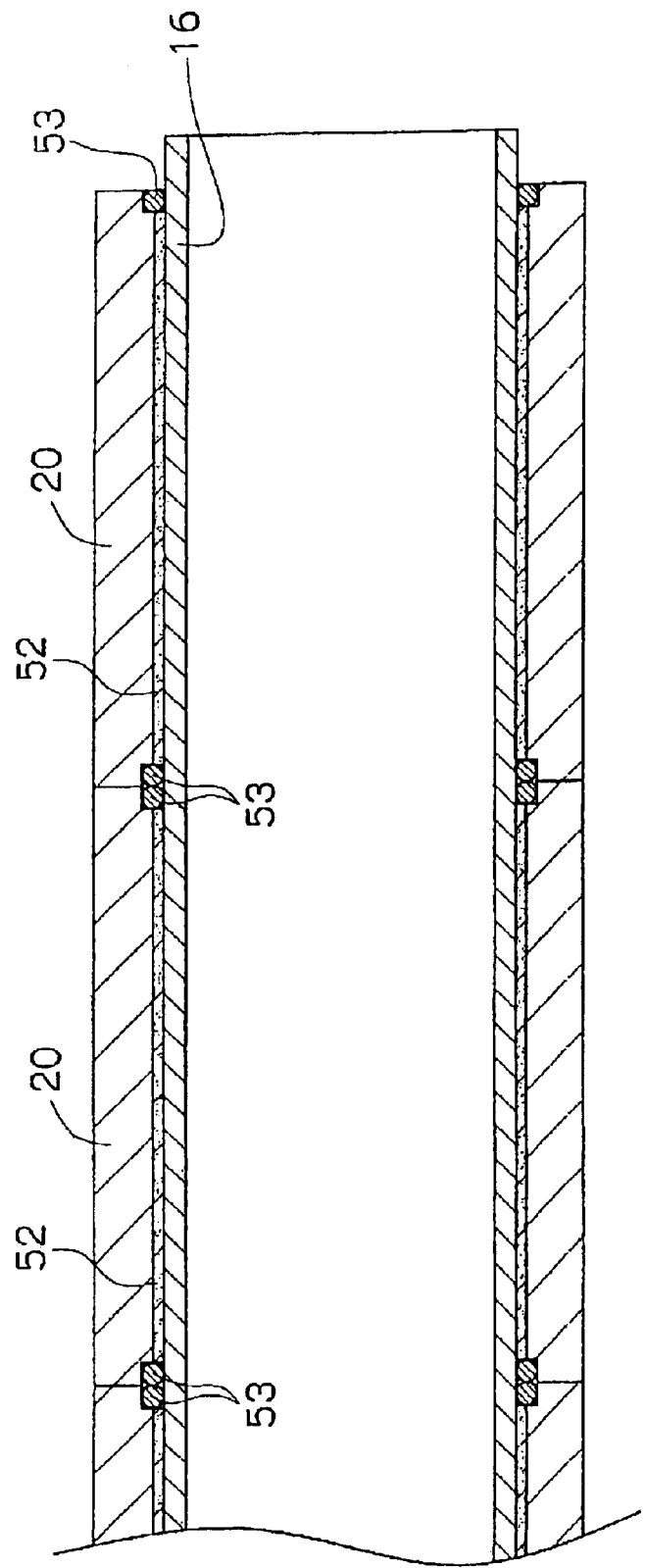
FIG. 8 is a cross-sectional view illustrating another embodiment of joining a plurality of target materials.

FIG. 7 is a cross-sectional view of a cylindrical target according to another embodiment of the present invention. In FIG. 7, the members same as or similar to these in FIG. 3 are indicated by the same numeric symbols, and description of these members is omitted. As illustrated in FIG. 7, in order to ensure the prevention of particle generation from the electroconductive felt 52 as a buffer member, it is preferred to carry out step-forming grinding to inner surface of both ends of the target material 20 and heat resisting O-rings 53 are disposed at step portions 20A. The material of the heat resisting O-ring 53 may, for example, be nitrile rubber, styrene butadiene rubber, ethylene propylene rubber, polyacryl rubber, silicon rubber or fluorine rubber. Particularly, silicon rubber or fluorine rubber each having a high heat resistance, is preferred. The inner diameter of the heat resisting O-ring is preferably slightly smaller than the outer diameter of the backing tube 16, and the thickness is preferably from 2 to 5 mm.

A specific description in the case of using the above heat resisting O-ring 53, will be made below.

EXAMPLE 2

A cylindrical target for forming an SiO$_2$ thin film in a DC magnetron sputtering apparatus, was produced as follows.

As a target material 20, a hollow cylindrical SiC burnt body impregnated with Si having an outer diameter of φ152 mm, an inner diameter of φ138 mm and a length of 220 mm, was prepared and six pieces of this were connected to have a total length of 1320 mm. The inner circumferential surface of the target material 20 was left to be a burnt surface, the outer peripheral surface was ground, and both ends of the burnt body was cut to have a length of 220 mm, and further, the inner surface of both ends of the burnt body was ground to form steps. The accuracy of the inner diameter was about ±0.5 mm due to e.g. deformation at the time of preparing the burnt body.

The backing tube 16 for supporting the target material 20, was formed by employing a commercially available tube made of SUS304 (according to JIS G3459: 135A (outer diameter)×Sch40 (thickness)) and grinding it to have an outer diameter of φ136 mm, an inner diameter of φ127 mm and a length of 1377 mm.

The target material 20 as an outer cylinder and the backing tube 16 as an inner cylinder were joined by compressively packing a carbon felt (having an initial state density of 0.12 g/cm$^3$ and an initial state volume resistivity in the direction of the thickness of 8 Ω·cm) having a thickness (initial state thickness) of 2 mm in the spacing therebetween. Since the spacing is 1 mm in average, the compression ratio of the carbon felt becomes 50% at this time.

The carbon felt was used as cut from a commercially available rolled felt having a width of 1 m and a length of 5 m, into a piece having a size adaptable to the inner area of the target material 20. Considering the thickness of the heat resisting O-rings 53 disposed on inner surface of both ends of the target material 20, the carbon felt having a size in the direction of the length slightly smaller than the length (220 mm) of the target material 20, is employed.

In this Example 2, the heat resisting O-rings 53 made of a silicon rubber having a thickness of 3 mm and a inner diameter of φ129 mm, are employed. In this case, the dimension of the step portions 20A are made to be 5 mm which is slightly larger than the thickness of the heat resisting O-rings 53. Accordingly, as the carbon felt, one having a size of 430 mm×210 mm, is employed.

In the joining step, a cut carbon felt was provided (wound) on the inner surface of the target material 20, and they were fit on the outside of the backing tube 16 by employing a special jig in the same manner as in Example 1. Then, heat resisting O-rings 53 were arranged on the inner surface of both ends of the target material 20. These operations were repeated for six pieces of target material 20 to complete the joining of the target materials having a total length of 1320 mm.

The cylindrical target thus obtained, can be used for sputtering in the same manner as in Example 1, and has an advantage that particle generation can be prevented for long period of time by a sealing effect of the heat resisting O-rings 53.

INDUSTRIAL APPLICABILITY

As described above, according to the cylindrical target and its producing method of the present invention, the structure that a hollow cylindrical target material and a backing tube for supporting this, are joined via a buffer member such as a carbon felt present therebetween, is provided. Therefore, there are few limitations with respect to the combination of the target material and the backing tube material, whereby more proper material selection becomes possible. Further, according to the present invention, the joining operation of the target material to the backing tube, and the operation to separate a worn target material from the backing tube, are easy, and reuse of the backing tube is possible, whereby a large economical effect can be obtained by reducing the manufacturing cost.

Further, the cylindrical target according to the present invention has an effect that between the target material and the backing tube, a buffer member is filled without gap, and accordingly, no gap will be generated at the joining portion. Further, the producing method of the cylindrical target according to the present invention, is easy to carry out and can achieve a reduced cost of the cylindrical target.

The entire disclosure of Japanese Patent Application No. 2000-273572 filed on Sep. 8, 2000 including specification, claims, drawings and summary is incorporated herein by reference in its entirety.

What is claimed is:

1. A cylindrical target comprising:
   a cylindrical backing tube;
   a hollow cylindrical target material disposed on an outer circumference of the cylindrical backing tube; and
   an electroconductive felt configured to join said backing tube and said target material and present between said backing tube and said target material.

2. The cylindrical target according to claim 1, wherein the electroconductive felt is compression-deformable, is sheet-shaped, and is compressively packed between the backing tube and the target material.

3. The cylindrical target according to claim 1, wherein a carbon felt is employed as said electroconductive felt.

4. The cylindrical target according to claim 3, wherein said carbon felt has a thickness of from 0.5 to 10 mm in an initial state before the carbon felt is compressively packed between said backing tube and said target material, and a compression ratio is from 10 to 80% when the carbon felt is compressively packed.

5. The cylindrical target according to claim 1, wherein said target material is a hollow cylindrical member made of ceramics.

6. The cylindrical target according to claim 1, wherein a plurality of target materials are joined to a single backing tube.

7. A method of producing a cylindrical target, comprising:
   providing an electroconductive felt on an inner surface of a target material having a hollow cylindrical shape; and
   inserting a backing tube into the target material such that said electroconductive felt is positioned between an outer circumferential surface of said backing tube and the inner surface of said target material, whereby said target material is joined to said backing tube to obtain said cylindrical target.

8. The method of producing a cylindrical target according to claim 7, wherein
   the electroconductive felt is compression-deformable, is sheet-shaped and is provided on the inner surface of said target material, and
   by the inserting of said backing tube, said electroconductive felt is packed between the outer circumferential surface of said backing tube and the inner surface of said target material.

9. A cylindrical target comprising:
   a cylindrical backing tube;
   a hollow cylindrical target material disposed on an outer circumference of the cylindrical backing tube; and
   a compression-deformable electroconductive carbon sheet configured to join said backing tube and said target material and present between said backing tube and said target material.

10. The cylindrical target according to claim 9, wherein the compression-deformable electroconductive carbon sheet is compressively packed between said backing tube and said target material.

11. A method of producing a cylindrical target, comprising:
   providing a compression-deformable electroconductive carbon sheet on an inner surface of a target material having a hollow cylindrical shape; and
   inserting a backing tube into said target material such that said compression-deformable electroconductive carbon sheet is positioned between an outer circumferential surface of said backing tube and the inner surface of said target material, whereby said target material is joined to said backing tube to obtain said cylindrical target.

12. The method of producing a cylindrical target according to claim 11, wherein
   said compression-deformable electroconductive carbon sheet is provided on the inner surface of said target material, and
   by the inserting of said backing tube, said compression-deformable electroconductive carbon sheet is compressed between the outer circumferential surface of said backing tube and the inner surface of said target material.

* * * * *